(12) United States Patent
Borgmann

(10) Patent No.: US 10,788,941 B2
(45) Date of Patent: Sep. 29, 2020

(54) METHOD FOR DETECTING CONTACT ON A CAPACITIVE SENSOR ELEMENT

(71) Applicant: Leopold Kostal GmbH & Co. KG, Luedenscheid (DE)

(72) Inventor: Uwe Borgmann, Recklinghausen (DE)

(73) Assignee: KOSTAL Automobil Elektrik GmbH & Co. KG, Luedenscheid (DE)

( * ) Notice: Subject to any disclaimer, the term of this patent is extended or adjusted under 35 U.S.C. 154(b) by 0 days.

(21) Appl. No.: 16/354,699

(22) Filed: Mar. 15, 2019

(65) Prior Publication Data

US 2019/0212845 A1   Jul. 11, 2019

Related U.S. Application Data

(63) Continuation of application No. PCT/EP2017/073118, filed on Sep. 14, 2017.

(30) Foreign Application Priority Data

Sep. 17, 2016 (DE) .................. 10 2016 011 272

(51) Int. Cl.
  *G06F 3/044* (2006.01)
  *G01R 27/26* (2006.01)
  (Continued)

(52) U.S. Cl.
  CPC ......... *G06F 3/044* (2013.01); *G01R 27/2605* (2013.01); *G06F 3/0416* (2013.01);
  (Continued)

(58) Field of Classification Search
  None
  See application file for complete search history.

(56) References Cited

U.S. PATENT DOCUMENTS 7,977,954 B2 * 7/2011 Reynolds ........... G01R 27/2605
                                                    324/676
8,552,994 B2   10/2013 Simmons
(Continued)

FOREIGN PATENT DOCUMENTS

DE    102006045737 A1    3/2008
DE    102010041464 A1    4/2011

OTHER PUBLICATIONS

European Patent Office, International Search Report for International Application No. PCT/EP2017/073118, dated Nov. 20, 2017.
(Continued)

*Primary Examiner* — Duane N Taylor, Jr.
(74) *Attorney, Agent, or Firm* — Brooks Kushman P.C.

(57) ABSTRACT

A method for detecting contact of a capacitive sensor includes transferring charge quantities in multiple successive cycles from the capacitive sensor to an integration capacitor having a known capacitance value. A voltage of the integration capacitor is measured. The measured voltage is processed to generate a sensor amplitude that is indicative of a capacitance value of the capacitive sensor. Contact of the capacitive sensor is detected based on a temporal behavior of the sensor amplitude. For instance, contact of the capacitive sensor is detected based on the rate of change of the sensor amplitude.

7 Claims, 2 Drawing Sheets

(51) Int. Cl.
 H03K 17/96 (2006.01)
 G06F 3/041 (2006.01)
(52) U.S. Cl.
 CPC . *H03K 17/962* (2013.01); *H03K 2217/96071* (2013.01); *H03K 2217/96073* (2013.01)

(56) References Cited

U.S. PATENT DOCUMENTS

| | | |
|---|---|---|
| 10,126,340 B2 | 11/2018 | Simmons |
| 2008/0111714 A1 | 5/2008 | Kremin |
| 2010/0252408 A1 | 10/2010 | Yamauchi |
| 2011/0073383 A1 | 3/2011 | Simmons |
| 2011/0261006 A1* | 10/2011 | Joharapurkar ........ G06F 3/0416 345/174 |
| 2012/0176179 A1 | 7/2012 | Harders et al. |
| 2014/0039819 A1 | 2/2014 | Simmons |
| 2014/0266257 A1 | 9/2014 | Maharyta |
| 2014/0267132 A1 | 9/2014 | Rabii et al. |

OTHER PUBLICATIONS

German Patent Office, German Search Report for corresponding German Patent Application No. 10 2016 011 272.7 dated Oct. 18, 2018.

The International Bureau of WIPO, International Preliminary Report on Patentability for International Application No. PCT/EP2017/037118, dated Mar. 19, 2019.

* cited by examiner (Background)

METHOD FOR DETECTING CONTACT ON A CAPACITIVE SENSOR ELEMENT

CROSS-REFERENCE TO RELATED APPLICATIONS

This application is a continuation of International Application No. PCT/EP2017/073118, published in German, with an International filing date of Sep. 14, 2017, which claims priority to DE 10 2016 011 272.7, filed Sep. 17, 2016; the disclosures of which are hereby incorporated in their entirety by reference herein.

TECHNICAL FIELD

The present invention relates to a method for detecting contact of a capacitive sensor in which the method includes using an integration process that involves charge quantities being transferred in multiple successive integration cycles from the capacitive sensor to an integration capacitor having a known capacitance value, measuring a voltage of the integration capacitor during the integration process, and processing the measured voltage to generate a sensor amplitude, the sensor amplitude being indicative of a capacitance value of the capacitive sensor.

BACKGROUND

Methods of this type are used to evaluate capacitive sensors. Capacitive sensors include capacitive contact sensors and capacitive proximity sensors. A capacitive sensor can detect the presence of a contact or approach by an object within a sensitive area. For instance, the object may be a body part such as a finger of a user or may be a utensil such as a pen of a user. A capacitive sensor, with an appropriate design, can also detect the location of the contact or approach by the object. The contact-sensitive (i.e., touch-sensitive) area may be superimposed on a display screen, for example. In a display application, a capacitive sensor allows a user to directly interact with what is displayed on the display screen and not just interact indirectly via a mouse or similar input device.

There are several different types of contact sensors. For example, the types of contact sensors include resistive contact sensors, contact sensors with acoustic surface waves, and capacitive contact sensors. Capacitive contact sensors, in which an approach may be detected, have become widely used.

When an object touches or comes close to the surface of a capacitive sensor, a change in the capacitance value of the capacitive sensor occurs. The task of an associated controller or measuring method used by the controller is to process the change in capacitance of the capacitive sensor to detect the triggering contact or approach.

A difficulty is that capacitance values of capacitive sensors, and particularly changes of the capacitance values to be detected, are relatively small. For this reason, the capacitance values are preferably measured using so-called integration processes. An integration process involves small charge quantities being transferred in multiple successive cycles from the capacitive sensor to an integration capacitor. The capacitance value of the capacitive sensor, which is to be measured, is variable and relatively small. The integration capacitor has a known capacitance value that is fixed and is much larger than the capacitance value of the capacitive sensor. The voltage that is present at the integration capacitor during the integration process is measured by an analog-to-digital converter (ADC) and processed to give a sensor amplitude. The sensor amplitude is indicative of the capacitance value of the capacitive sensor.

DE 10 2010 041 464 A1 (corresponds to U.S. Pat. No. 10,126,340) describes a method for detecting contact of a capacitive sensor. The method uses an integration process of the type described above to obtain the sensor amplitude. The method continuously detects and compares the sensor amplitude after each integration cycle to a predefined amplitude threshold value. The sensor amplitude remains at an essentially constant base value while an object such as a finger to be detected does not approach the capacitive sensor. In contrast, the sensor amplitude increases significantly as the object approaches the capacitive sensor. The actual recognition of contact of the capacitive sensor takes place when the sensor amplitude exceeds a preset amplitude threshold value.

The sensor amplitude is a function of many parameters. Thus, not only does the shape and dimensions of an object such as a finger of a user that is being used to trigger the capacitive sensor, for example thinner or thicker fingers, influence the sensor amplitude, but, for example, the positioning of the finger above the capacitive sensor also influences the sensor amplitude. Thus, the greatest sensitivity is typically present directly above the center of gravity of the capacitive sensor and decreases toward its edge. These influences may be compensated for only to a limited extent by the elasticity of the skin surface or of the finger.

In typical arrangements of capacitive sensor surfaces, particularly in a motor vehicle and in the described evaluation, reliably triggering a control function, associated with recognizing the contact on the capacitive sensor, via a preset amplitude threshold value cannot be ensured.

Possibly operating the sensor function while wearing gloves further exacerbates the problem. For a configuration of the amplitude threshold value that allows operation with gloves, erroneous recognition of a presumed contact would take place over several millimeters of the sensor surface during operation without gloves.

Optionally desired active haptic feedback via an actuator system such as a solenoid, a vibration motor, or the like likewise requires contact with the surface. For this purpose, in the prior art the capacitive sensor system must be supplemented with a force sensor system, which is technically very complex and costly.

SUMMARY

An object of the present invention is a method for detecting contact of a capacitive sensor in which the method has the advantage over the above-described prior art in having an equally high sensitivity with respect to the detection of actual contact of the capacitive sensor virtually independently of the described influencing parameters such as size, shape, and positioning of the object/finger and gloves of different thicknesses.

A method in accordance with the present invention achieves this advantage by evaluating and using the temporal behavior of the sensor amplitude to detect contact of the capacitive sensor. As such, the method makes use of the fact that the temporal behavior of the sensor amplitude when the capacitive sensor is approached or contacted is largely independent of the described influencing parameters.

An embodiment provides a method for detecting or recognizing contact on a capacitive sensor element ("capacitive sensor"). The method includes measuring a capacitance value of the capacitive sensor by a continuously applied integration process in which respective voltages applied to an integration capacitor with a known capacitance value are measured by an analog-to-digital converter (ADC) and are processed to give a raw sensor value (i.e., the sensor amplitude). Temporal behavior of the senor amplitude is evaluated and used to detect contact on the capacitive sensor.

In carrying out at least one of the above and/or other objects, a method for detecting contact of a capacitive sensor is provided. The method includes transferring charge quantities in multiple successive cycles from the capacitive sensor to an integration capacitor having a known capacitance value. A voltage of the integration capacitor is measured such as by an ADC. The measured voltage is processed such as by a computer processor to generate a sensor amplitude. The sensor amplitude is indicative of a capacitance value of the capacitive sensor as the sensor amplitude is based on the voltage of the integration capacitor which is indicative of the capacitance value of the capacitive sensor. Contact of the capacitive sensor is detected based on a temporal behavior of the sensor amplitude. For instance, contact of the capacitive sensor is detected based on the rate of change of the sensor amplitude.

In embodiments, contact of the capacitive sensor is detected based on the temporal behavior of the sensor amplitude. When a finger (or some other body part or object) approaches the capacitive sensor from a large distance, the sensor amplitude steadily increases. When the finger contacts the capacitive sensor, the finger decelerates and is deformed in terms of its elasticity. This process is reflected in the temporal behavior of the sensor amplitude in such a way that the sensor amplitude initially increases much more slowly and then remains essentially constant when the finger makes full contact on the capacitive sensor.

This temporal behavior of the sensor amplitude (including the sensor amplitude steadily increasing as the finger approaches the capacitive sensor and the sensor amplitude initially increasing much more slowly and then remaining essentially constant when the finger makes full contact on the capacitive sensor) is largely independent of the size of the finger, the positioning of the finger on the sensor surface, and whether gloves are used. Thus, by recognizing the point in time at which the sensor amplitude increases much more slowly, or a point in time shortly thereafter in which the sensor amplitude is essentially constant, the contact of the finger on the capacitance sensor may be reliably detected.

In an embodiment of the method, a rate of change of the sensor amplitude is determined and used for recognizing contact of the capacitive sensor. The rate of change may be determined as the rise time needed by the sensor amplitude to increase from a change starting value to a change target value.

Contact of the capacitive sensor may be recognized in a particularly reliable manner when the rate of change is between a change minimum value and a change maximum value and the sensor amplitude at a predefined waiting time thereafter is between an amplitude minimum value and an amplitude maximum value.

BRIEF DESCRIPTION OF THE DRAWINGS

Further advantageous embodiments result from the following description of an exemplary embodiment of a method according to the present invention. The method according to the present invention is described below with reference to the drawing in which.

Figure 1:
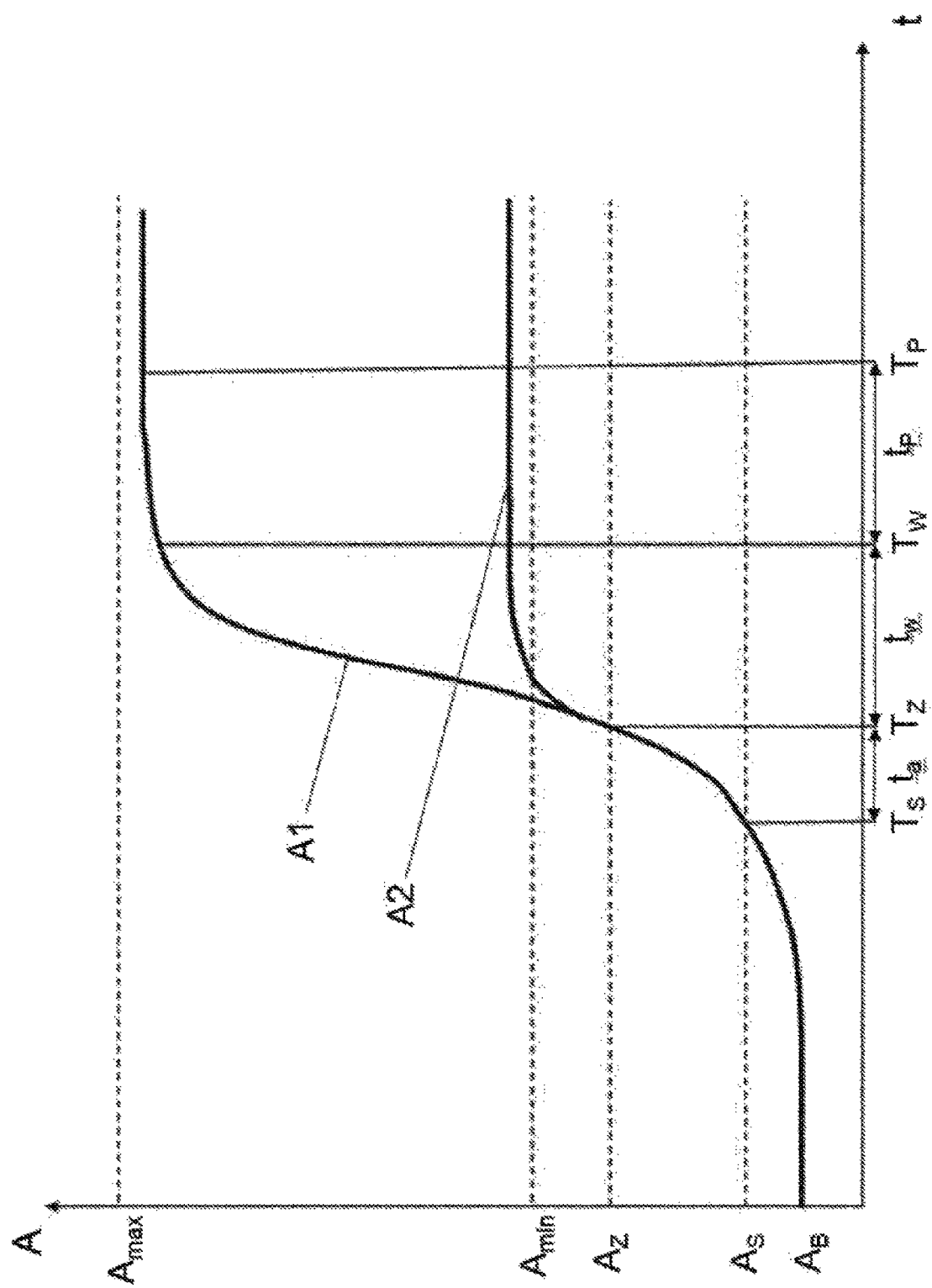
FIG. 1 illustrates a time curve of the sensor amplitude A when a touch-sensitive capacitive sensor is approached and subsequently contacted during different first and second touch applications, the first touch application resulting in sensor amplitude A1 and the second touch application resulting in sensor amplitude A2.
Figure 1A:
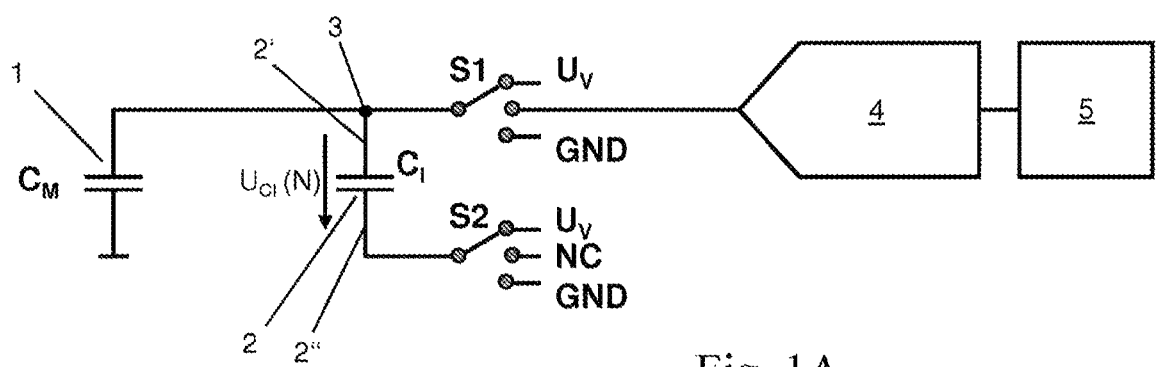
FIG. 1A illustrates a diagram of a known system for carrying out an integration process to measure a capacitance value of the capacitive sensor.

Referring initially to FIG. 1A, a diagram of a known system for carrying out an integration process to measure a capacitance value $C_M$ of a capacitive sensor 1 is shown. The system has an integration capacitor 2, a first switch S1, a second switch S2, an A/D converter 4, and a processor 5. A terminal of capacitive sensor 1 is electrically connected to a first terminal 2' of integration capacitor 2 at a shared circuit node 3. Shared circuit node 3 is also electrically connected to first switch S1. Shared circuit node 3, via first switch S1, is connectable to (i) a fixed supply voltage $U_V$, (ii) potential-free, i.e., held open (NC), or (iii) the ground GND. A second terminal 2" of integration capacitor 2 is electrically connected to second switch S2. Second terminal 2" of integration capacitor 2, via second switch S2, is connectable to (i) the fixed supply voltage $U_V$, (ii) an input of an A/D converter, or (iii) the ground GND. First and second switches S1 and S2 are switched in a known manner to implement the integration process in which small charge quantities are transferred from capacitive sensor 1 to integration capacitor 2 in multiple successive cycles. A/D converter 4 measures the voltage $U_{CI}(N)$ present at integration capacitor 2 after a number N of these charge transfers. Processor 5 processes the measured voltage to generate a sensor amplitude.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

FIG. 1 illustrates the time curve of the sensor amplitude A when a touch-sensitive capacitive sensor is approached and subsequently contacted, for two different applications. The first application results in sensor amplitude A1 plotted in FIG. 1 and the second application results in sensor amplitude A2 also plotted in FIG. 1.

Thus, the top measurement curve shows the time curve of the detected sensor amplitude A1 when the capacitive sensor is approached and subsequently contacted in the center of the capacitive sensor by a large finger without a glove. In contrast, the bottom measurement curve shows the corresponding curve of the sensor amplitude A2 when the same capacitive sensor is approached and subsequently contacted at the edge of the capacitive sensor by a small finger with a glove.

These two measurement curves or sensor amplitudes A1 and A2 thus represent borderline cases with extremely different conditions. These different conditions are, however, to be handled using the same recognition method for detecting contact on the capacitive sensor.

Before a finger approaches the capacitive sensor, the sensor amplitude A for both measurement curves remains at a base amplitude value $A_B$ that is essentially constant or changes only slowly due to external influences such as temperature fluctuations. As soon as the finger approaches the capacitive sensor, the sensor amplitude A begins to slowly increase. The rate of change $\Delta A/\Delta t$ of the sensor amplitude A is used to obtain a necessary criterion for recognizing actual contact of the capacitive sensor.

In this exemplary embodiment, the rate of change $\Delta A/\Delta t$ of the sensor amplitude A is specifically ascertained by determining a rise time $t_a$. The rise time $t_a$ is the time needed for the sensor amplitude A to increase from a change starting amplitude value $A_S$ at point in time $T_S$ to a change target amplitude value $A_Z$ at point in time $T_Z$. This rise time $t_a = T_Z - T_S$ is inversely proportional to the rate of change $\Delta A/\Delta t$ of the sensor amplitude A and may thus be used as a measure of the sought rate of change.

In this exemplary embodiment, the change starting amplitude value $A_S$ and the change target amplitude value $A_Z$ are predetermined parameters. Particularly, the change starting amplitude value $A_S$ and the change target amplitude value $A_Z$ for the present physical implementation of the capacitive sensor are experimentally determined in such a way that they are used to detect the rate of change $\Delta A/\Delta t$ of the sensor amplitude A in a range in which this is as similar as possible for most applications. In this regard, in the example shown in FIG. 1 of the two measurement curves with the sensor amplitudes A1 and A2, the rate of change $\Delta A/\Delta t$ of sensor amplitudes A1 and A2 for the two diverse applications is identical in the selected range.

As a necessary criterion for the recognition of actual contact of the capacitive sensor, the rate of change $\Delta A/\Delta t$ of the sensor amplitude A must be between a rate of change minimum value $(\Delta A/\Delta t)_{min}$ and a rate of change maximum value $(\Delta A/\Delta t)_{max}$. That is, the determined rise time $t_a$ must be in a predefined range between a minimum time value $t_{a\;min}$ and a maximum time value $t_{a\;max}$.

Such a criterion that responds to the dynamics of the signal curve thus naturally has a very sensitive response to possible interferences of the signal. For this reason, a further criterion is necessary for reliably recognizing actual contact of the capacitive sensor.

The sensor amplitude A itself is considered for defining such a criterion. In contrast to an interference, caused by electromagnetic pulses, for example, during actual contact of the capacitive sensor, the sensor amplitude A must have a value that is greatly above the base amplitude value $A_B$. On the other hand, a sensor amplitude A that is significantly higher than a maximum value to be expected based on the physical characteristics would once again indicate interference. As such, a maximum amplitude value $A_{max}$ is defined, below which the sensor amplitude A must lie to assume a signal without interference.

The further criterion therefore requires that the sensor amplitude A is between an amplitude minimum value $A_{min}$ and the amplitude maximum value $A_{max}$ at a waiting time $T_W$. The waiting time $T_W$ corresponds to the expiration of a predefined time period $t_w$ after the point in time $T_Z$ that the change target amplitude value $A_Z$ is exceeded. The time period $t_w$, which corresponds to a waiting time until an at least essentially constant sensor amplitude A is reached, is set by multiplying the previously determined rise time $t_a$ by a constant factor w. The constant factor w is a function of the physical implementation of the capacitive sensor and must be experimentally determined, so that the following must apply: $t_w = w \cdot t_a$, and thus, $T_W = T_Z + w \cdot t_a$.

Although the sensor amplitudes A1 and A2 for the two measurement curves are greatly different at the waiting time $T_W$, which is attributed to the described different physical conditions for the two applications, both sensor amplitudes A1 and A2 are within the range defined by the amplitude minimum value $A_{min}$ and the amplitude maximum value $A_{max}$, so that valid contact of the capacitive sensor is established in both cases.

To further ensure the reliability of the sensor evaluation, and particularly more reliably avoid false positive recognitions, a third criterion may be defined. The aim of the third criterion is to confirm that the sensor amplitude A at the waiting time $T_W$ is not only between the amplitude minimum value $A_{min}$ and the amplitude maximum value $A_{max}$ but is also essentially constant. For this purpose, a check is made at a check time $T_P$ as to whether the sensor amplitude A has not increased or decreased from its value at waiting time $T_W$ by more than an allowable positive tolerance $\delta A+$ or a negative tolerance $\delta A-$, respectively.

The check time $T_P$ should be as close as possible to the waiting time $T_W$ but should allow at least enough time for the sensor amplitude A to assume a debounced state after reaching an essentially constant value. Therefore, a test time period $t_p$ is specified that meets this requirement for the capacitive sensor arrangement, and the check time is set to $T_P = T_W + t_p$.

At this check time $T_P$, the following must apply for the sensor amplitude A:

$$(A - \delta A-) < A < (A + \delta A+).$$

Contact of the capacitive sensor that is recognized as valid according to the above-described criteria is therefore rejected as invalid in this last step if, at check time $T_P$, the sensor amplitude A differs from its value at waiting time $T_W$ by more than the allowed positive tolerance $\delta A+$ upwards or by more than the allowed negative tolerance $\delta A-$ downwards.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A method for detecting contact of a capacitive sensor, the method comprising:
    transferring charge quantities in multiple successive cycles from the capacitive sensor to an integration capacitor having a known capacitance value;
    measuring a voltage of the integration capacitor;
    processing the measured voltage to generate a sensor amplitude, the sensor amplitude being indicative of a capacitance value of the capacitive sensor;
    determining a rate of change of the sensor amplitude from a rise time for the sensor amplitude to increase from a predetermined change starting amplitude value to a predetermined change target amplitude value; and
    detecting contact of the capacitive sensor based on the rate of change of the sensor amplitude.

2. The method of claim 1 wherein:
    each of the predetermined change starting amplitude value and the predetermined change target amplitude value is a function of a physical implementation of the capacitive sensor.

3. The method of claim 1 further comprising:

detecting contact of the capacitive sensor upon the rise time falling in a range between a predetermined minimum rise time threshold and a predetermined maximum rise time threshold.

4. The method of claim 3 further comprising:

detecting contact of the capacitive sensor upon (i) the rise time falling in the range between the predetermined minimum rise time threshold and the predetermined maximum rise time threshold and (ii) at expiration of a predetermined wait time after the sensor amplitude exceeds the predetermined change target amplitude value, the sensor amplitude falling in a range between a predetermined amplitude minimum value and a predetermined amplitude maximum value.

5. The method of claim 4 wherein:

the predetermined wait time is a function of a physical implementation of the capacitive sensor.

6. The method of claim 4 further comprising:

detecting contact of the capacitive sensor upon (i) the rise time falling in the range between the predetermined minimum rise time threshold and the predetermined maximum rise time threshold, (ii) at expiration of a predetermined wait time after the sensor amplitude exceeds the predetermined change target amplitude value, the sensor amplitude falling in a range between a predetermined amplitude minimum value and a predetermined amplitude maximum value, and (iii) at expiration of a predetermined check time after expiration of the predetermined wait time, the sensor amplitude has not increased or decreased from its value at the expiration of the predetermined wait time more than an allowed positive tolerance or an allowed negative tolerance, respectively.

7. The method of claim 1 wherein:

measuring the voltage of the integration capacitor includes measuring the voltage of the integration capacitor after each cycle.

* * * * *